US009779794B2

(12) United States Patent
Doyle et al.

(10) Patent No.: US 9,779,794 B2
(45) Date of Patent: Oct. 3, 2017

(54) TECHNIQUES FOR FORMING SPIN-TRANSFER TORQUE MEMORY (STTM) ELEMENTS HAVING ANNULAR CONTACTS

(71) Applicant: INTEL CORPORATION, Santa Clara, CA (US)

(72) Inventors: Brian S. Doyle, Portland, OR (US); David L. Kencke, Beavertown, OR (US); Kaan Oguz, Beaverton, OR (US); Mark L. Doczy, Beaverton, OR (US); Satyarth Suri, Hillsboro, OR (US); Robert S. Chau, Beavertown, OR (US); Charles C. Kuo, Hillsboro, OR (US); Roksana Golizadeh Mojarad, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/116,457

(22) PCT Filed: Mar. 26, 2014

(86) PCT No.: PCT/US2014/031854
§ 371 (c)(1),
(2) Date: Aug. 3, 2016

(87) PCT Pub. No.: WO2015/147813
PCT Pub. Date: Oct. 1, 2015

(65) Prior Publication Data
US 2016/0351238 A1    Dec. 1, 2016

(51) Int. Cl.
*H01L 43/08*    (2006.01)
*G11C 11/16*    (2006.01)
(Continued)

(52) U.S. Cl.
CPC ............ *G11C 11/161* (2013.01); *H01L 43/02* (2013.01); *H01L 43/08* (2013.01); *H01L 43/12* (2013.01)

(58) Field of Classification Search
CPC ......... H01L 43/08; H01L 43/12; G11C 11/16; B82Y 25/00
(Continued)

(56) References Cited

U.S. PATENT DOCUMENTS

| 2005/0023581 | A1 | 2/2005 | Nuetzel et al. |
| 2010/0096716 | A1* | 4/2010 | Ranjan ................. B82Y 10/00 257/421 |

(Continued)

FOREIGN PATENT DOCUMENTS

| WO | 2010080510 A1 | 7/2010 |
| WO | 2013095357 A1 | 6/2013 |
| WO | 2015147813 A1 | 10/2015 |

OTHER PUBLICATIONS

International Preliminary Report on Patentability received for Patent Application No. PCT/US2014/031854, mailed on Oct. 6, 2016, 10 pages.

(Continued)

*Primary Examiner* — Jonathan Han
(74) *Attorney, Agent, or Firm* — Finch & Maloney PLLC

(57) ABSTRACT

Techniques are disclosed for forming a spin-transfer torque memory (STTM) element having an annular contact to reduce critical current requirements. The techniques reduce critical current requirements for a given magnetic tunnel junction (MTJ), because the annular contact reduces contact size and increases local current density, thereby reducing the current needed to switch the direction of the free magnetic layer of the MTJ. In some cases, the annular contact surrounds at least a portion of an insulator layer that prevents the passage of current. In such cases, current flows through (Continued)

the annular contact and around the insulator layer to increase the local current density before flowing through the free magnetic layer. The insulator layer may comprise a dielectric material, and in some cases, is a tunnel material, such as magnesium oxide (MgO). In some cases, a critical current reduction of at least 10% is achieved for a given MTJ.

25 Claims, 13 Drawing Sheets

(51) Int. Cl.
*H01L 43/12* (2006.01)
*H01L 43/02* (2006.01)

(58) Field of Classification Search
USPC ............ 257/E29.323, 421; 438/3; 360/324.2
See application file for complete search history.

(56) References Cited

U.S. PATENT DOCUMENTS

| | | | | |
|---|---|---|---|---|
| 2010/0276768 | A1* | 11/2010 | Gaidis | G11C 11/16 257/421 |
| 2011/0169112 | A1* | 7/2011 | Chen | B82Y 10/00 257/421 |
| 2011/0235217 | A1* | 9/2011 | Chen | H01L 43/12 360/324.2 |
| 2012/0063218 | A1* | 3/2012 | Huai | G11C 11/16 365/171 |

OTHER PUBLICATIONS

Taiwan Office Action and Search Report received for Taiwan Application No. 104103727, dated Aug. 18, 2016. 14 pages.
International Search Report and Written Opinion as received for Patent Application No. PCT/US2014/031854, mailed on Dec. 31, 2014, 13 pages.

* cited by examiner

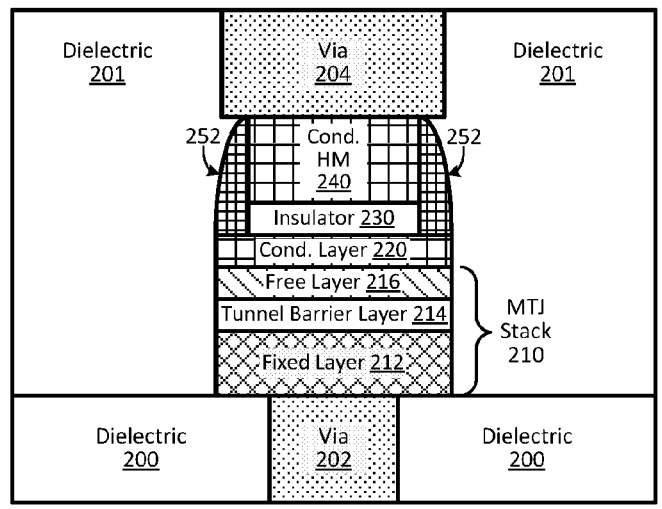
FIG. 2H
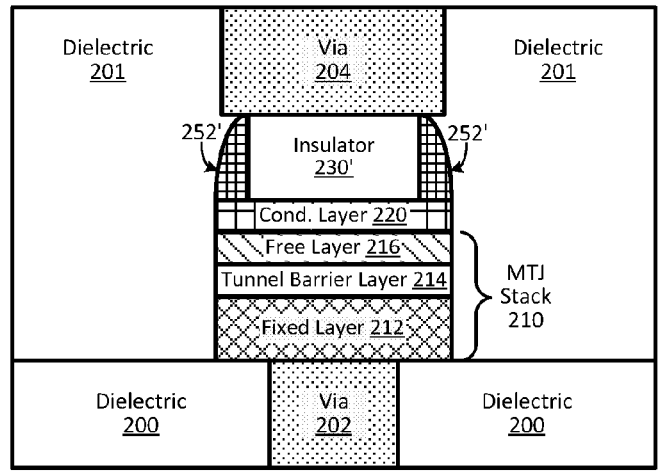
FIG. 2H'
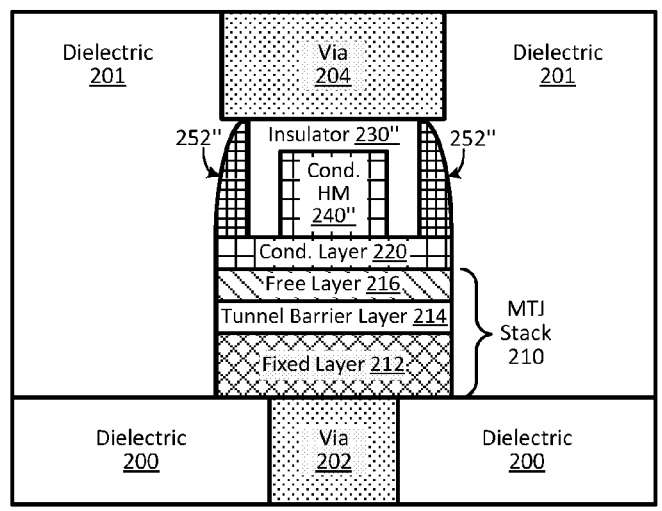
FIG. 2H"

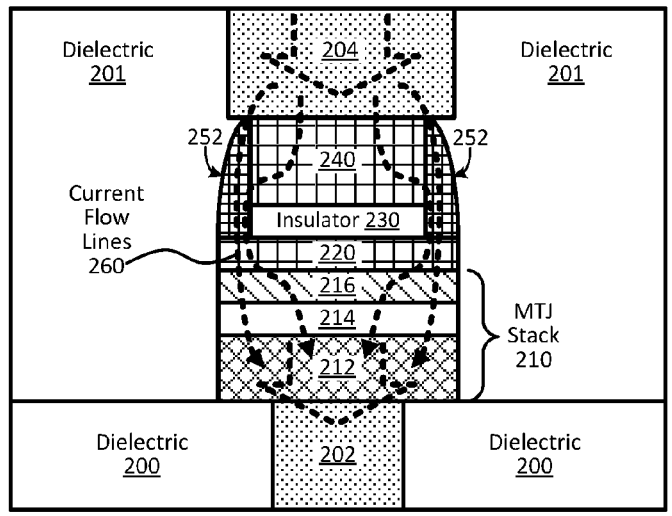
FIG. 2I
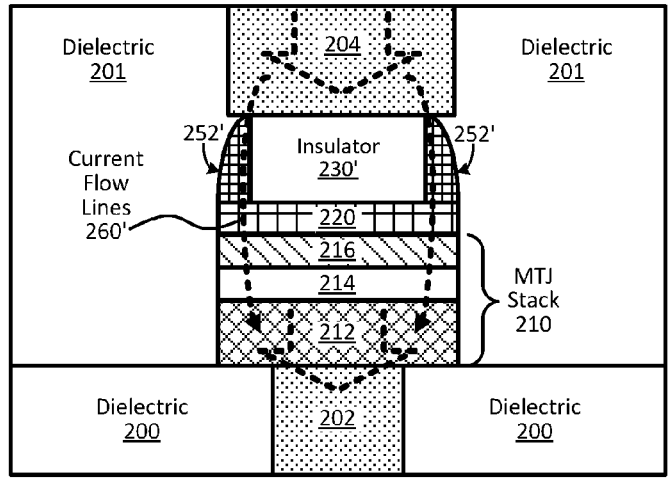
FIG. 2I'
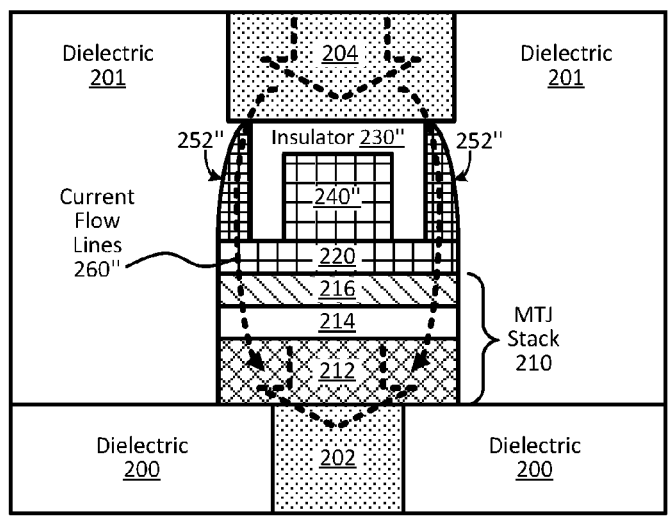
FIG. 2I"

TECHNIQUES FOR FORMING SPIN-TRANSFER TORQUE MEMORY (STTM) ELEMENTS HAVING ANNULAR CONTACTS

BACKGROUND

Spin-transfer torque memory (STTM) devices, such as spin-transfer torque random-access memory (STT-RAM) devices, use spin-based memory technology and include magnetic tunnel junctions (MTJs) that can store a bit of information. Each MTJ has a fixed layer and a free layer, and the direction of magnetization in the free layer determines whether the MTJ is in a high resistivity state or a low resistivity state (i.e., whether it is storing a 1 or a 0). In this manner, STTM is a non-volatile type of memory. The current needed to switch the magnetic direction of the free layer of the MTJ (e.g., during a write cycle) is referred to as the critical current.

BRIEF DESCRIPTION OF THE DRAWINGS

FIGS. 2A-H" illustrate example structures that are formed when carrying out the method of FIG. 1, in accordance with various embodiments.

FIGS. 2I-I" illustrate the structures of FIGS. 2H-H", respectively, electrically activated to show example current flow lines, in accordance with some embodiments.

DETAILED DESCRIPTION

Figure 1:
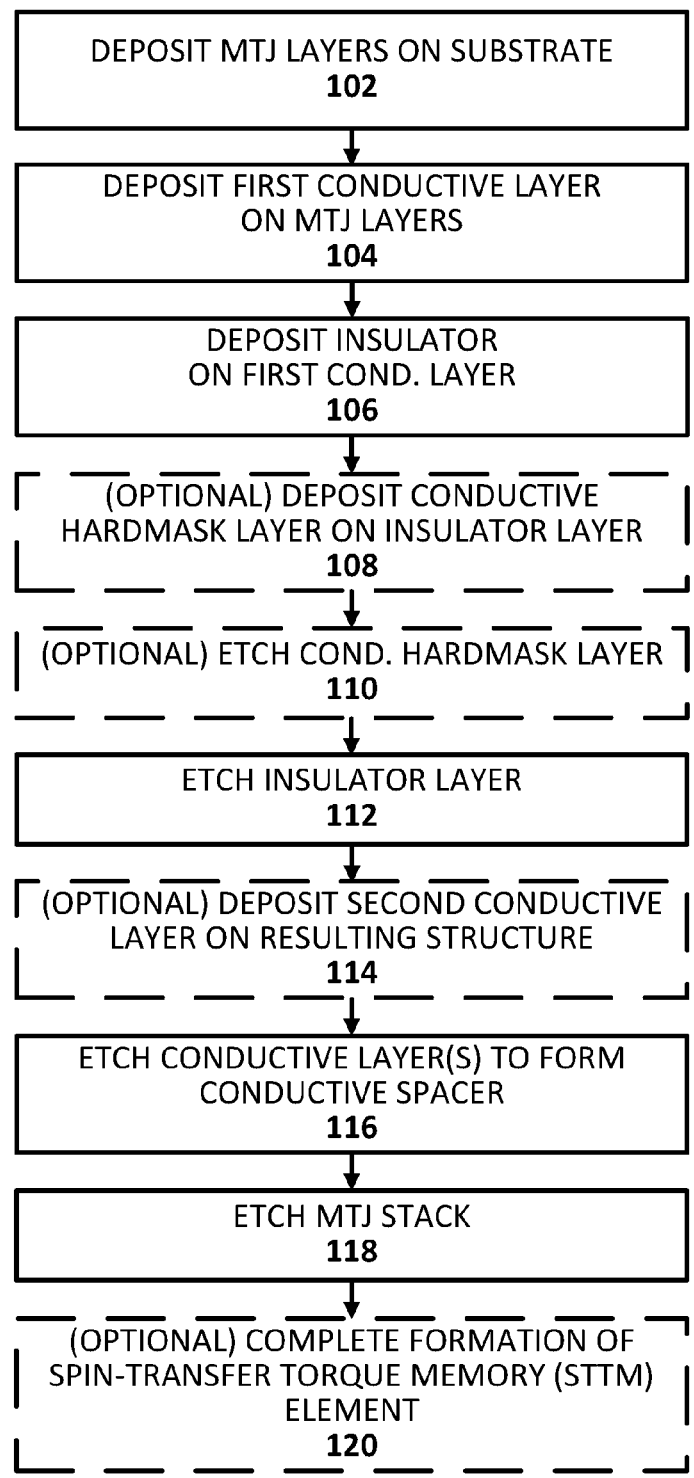
FIG. 1 illustrates a method of forming an integrated circuit, in accordance with one or more embodiments of the present disclosure.

Techniques are disclosed for forming a spin-transfer torque memory (STTM) element having an annular contact to reduce critical current requirements. The techniques reduce critical current requirements for a given magnetic tunnel junction (MTJ), because the annular contact reduces contact size and increases local current density, thereby reducing the current needed to switch the direction of the free magnetic layer of the MTJ. In some cases, the annular contact surrounds at least a portion of an insulator layer that prevents the passage of current. In such cases, current flows through the annular contact and around the insulator layer to increase the local current density before flowing through the free magnetic layer. The insulator layer may comprise a dielectric material, and in some cases, is a tunnel material, such as magnesium oxide (MgO) or aluminum oxide ($Al_2O_3$). In some cases, use of an annular contact results in a critical current reduction of at least 10% for a given MTJ. Numerous configurations and variations will be apparent in light of this disclosure.

General Overview

As previously explained, the current needed to switch the magnetic direction of the free layer of a magnetic tunnel junction (MTJ) in, for example, a spin-transfer torque memory (STTM) element, is referred to as the critical current. It is desirable to reduce the critical current needed to switch the magnetic direction of the free layer, because the current through an STTM bit is limited by, for example, the current coming out of the transistor in a one transistor—one resistor (1T-1R) memory cell. Further, relatively high critical current requirements present issues for commercial applications. A current density in the order of 1-3 $MA/cm^2$ is typically required to switch the magnetic direction in the free layer of an MTJ. Current density can be increased by decreasing the size of the memory element, thereby lowering critical current requirements. However, decreasing the size of the memory element also reduces the overall stability of this non-volatile memory.

Thus, and in accordance with one or more embodiments of the present disclosure, techniques are disclosed for forming an STTM element having an annular contact to reduce critical current requirements for a given MTJ. Such techniques reduce critical current requirements for a given MTJ, because the free layer of the MTJ can be switched even though the required current density occurs in only a portion of the free layer and reducing contact size (e.g., via an annular contact) increases local current density. The term "annular" as used herein generally includes a substantially elliptical or circular ring/band shape. However, "annular" as used herein can also include any hollow shape and therefore, annular contacts, as variously described, need not be limited to substantially elliptical or circular ring/band shapes. For example, in some cases, the annular contact may have a substantially square or rectangular ring/band shape. Note that the shape of contacts as variously described herein (e.g., annular, circular, elliptical, square, rectangular, hollow, etc.) is the shape as viewed from the top of the integrated circuit structure, looking down on the MTJ stack, as will be apparent in light of this disclosure.

In some embodiments, the annular contact for the STTM element surrounds at least a portion of an insulator layer, where the insulator layer prevents the passage of current when the element is electrically activated. In this manner, current flow is directed through the conductive annular contact and around the insulator layer, thereby increasing current density as the current flows down into the free magnetic layer, resulting in a reduced critical current for a given MTJ. In some such embodiments, the insulator layer may be above the free magnetic layer of an MTJ. For example, in some embodiments, the insulator layer may be directly above or in physical contact with the free magnetic layer, while in other embodiments, the insulator may be above the free magnetic layer and separated by a conductive layer and/or a conductive hardmask layer, as will be apparent in light of this disclosure. The term "conductive" as used herein generally includes being conductive in at least an electrical sense (e.g., can conduct an electrical current).

In some embodiments, the insulator layer may be deposited on or in physical contact with the free magnetic layer. For example, in some embodiments, the insulator layer may comprise a tunnel material layer, such as magnesium oxide (MgO) or aluminum oxide ($Al_2O_3$), to increase the stability of the STTM element at the insulator layer/free magnetic layer interface. Other various tunnel materials may be used, such as materials suitable for the application of a tunnel barrier layer in an MTJ. In some such embodiments, the tunnel material layer may have a thicker inner portion (e.g., greater than 1 nm) that prevents the passage of current and a thinner outer portion (e.g., 1 nm or less) located under the annular contact that allows current to pass through to the free magnetic layer, as will be apparent in light of this disclosure.

In some embodiments, the annular contact (which may be formed from a conductive spacer, as will be apparent in light of this disclosure) comprises at least one of ruthenium (Ru), tungsten (W), titanium (Ti), tantalum (Ta), titanium nitride (TiN), and/or tantalum nitride (TaN). In some embodiments, the annular contact surface area comprises 10-90% of the surface area of the free magnetic layer, as viewed from above. In some such embodiments, the insulator layer (e.g., a dielectric or a tunnel material, such as MgO or $Al_2O_3$) comprises the hole in the annular contact and therefore may comprise the other 90-10% of the surface area of the free magnetic layer, as viewed from above. As previously described, the annular contact, may have a substantially circular, elliptical, square, or rectangular band/ring shape in some embodiments, thereby having either a consistent width (e.g., in the case of an exact circular band/ring) or varying widths (e.g., in the case of an exact elliptical band/ring). In any case, the minimal width of the annular contact may be approximately 3 nm, in some embodiments, because of, for example, resistance concerns.

The techniques provided herein can be employed to improve critical current requirements in any number of integrated circuit structures and configurations, such as in spin-transfer torque memory (STTM) devices, as previously described. Therefore, the disclosed techniques can be utilized, in accordance with some embodiments, in the formation of embedded and/or non-embedded non-volatile memory structures. However, the techniques as variously described herein may also be used to benefit other structures including a magnetic tunnel junction (MTJ), such as magnetoresistive random-access memory (MRAM) or thermal assisted switching MRAM (TAS-MRAM). In other words, the techniques described herein can be used in any suitable structure or device that would benefit from the use of an annular contact used to reduce the current needed to switch the magnetic direction of the free layer of an MTJ (referred to herein as the critical current). Thus, in some instances, the disclosed techniques can be used, for example, to reduce contact size to provide small, scalable memory cells.

Upon analysis (e.g., using scanning/transmission electron microscopy (SEM/TEM) and/or composition mapping), a structure configured in accordance with one or more embodiments will effectively show an annular contact or conductive spacer for a memory element as variously described herein. In addition, critical current requirements of such structures can be compared to similar memory elements having non-annular contacts (e.g., contacts that share the surface area of the free magnetic layer) to measure the benefit in critical current requirements achieved by using annular contacts as variously described herein. In some embodiments, use of an annular contact as variously described herein results in a critical current reduction of at least approximately 10% for a given MTJ; however, some embodiments may result in an even greater reduction of critical current requirements. Numerous configurations and variations will be apparent in light of this disclosure.

Architecture and Methodology

Figure 2A:
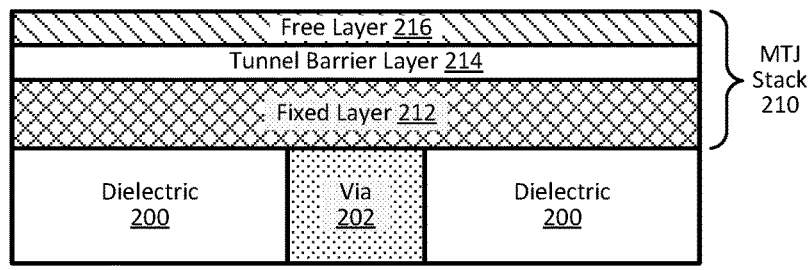

FIG. 1 illustrates a method 100 of forming an integrated circuit, in accordance with one or more embodiments of the present disclosure. FIGS. 2A-H" illustrate example structures that are formed when carrying out method 100 of FIG. 1, in accordance with various embodiments. FIGS. 2I-I" illustrate the structures of FIGS. 2H-H", respectively, electrically activated to show example current flow lines 260 and 260', in accordance with some embodiments. Although the techniques disclosed herein are primarily illustrated and described in the context of a spin-transfer torque memory (STTM) element, similar principles and techniques as variously described herein may be used for other integrated circuit structures. For example, the techniques described herein may be used for other structures including a magnetic tunnel junction (MTJ), such as magnetoresistive random-access memory (MRAM) or thermal assisted switching MRAM (TAS-MRAM). In other words, the techniques described herein can be used in any suitable structure or device that would benefit from the use of an annular contact used to reduce the current needed to switch the magnetic direction of the free layer of an MTJ (referred to herein as the critical current).

As can be seen in FIG. 1, method 100 includes depositing 102 MTJ layers 210 on a substrate to form the example resulting structure shown in FIG. 2A, in accordance with an embodiment. In this example embodiment, the substrate includes a first (or bottom) via 202 having dielectric layer 200 on either side of via 202. Via 202 may extend to an interconnect leading to, for example, a bit line, as will be apparent in light of this disclosure. Via 202 can be formed of any suitable electrically conductive material (or combination of materials), using any suitable technique, and the dimensions of via 202 can be customized as desired for a given target application or end use. For example, in some cases, via 202 may comprise copper (Cu), cobalt (Co), molybdenum (Mo), rhodium (Rh), beryllium (Be), chromium (Cr), manganese (Mn), aluminum (Al), titanium (Ti), indium (In), ruthenium (Ru), palladium (Pd), tungsten (W), and/or nickel (Ni). Dielectric 200 can be formed from any suitable dielectric or insulator material (or combination of such materials), using any suitable technique. For example, in some cases, dielectric 200 may comprise an oxide such as silicon dioxide ($SiO_2$) or carbon doped oxide (CDO), silicon nitride, organic polymers such as perfluorocyclobutane or polytetrafluoroethylene, fluorosilicate glass (FSG), and/or organosilicates such as silsesquioxane, siloxane, or organosilicate glass.

As shown in FIG. 2A, MTJ stack 210 includes fixed magnetic layer 212, tunnel barrier layer 214, and free magnetic layer 216. Fixed magnetic layer 212 (also referred to as a pinned magnetic layer) can be formed from any suitable magnetic material (or combination of such materials), using any of a wide range of techniques. In some embodiments, fixed magnetic layer 212 is composed of a material or stack of materials for maintaining a fixed majority spin. For example, in accordance with some embodiments, fixed magnetic layer 212 may be formed from: iron (Fe); tantalum (Ta); ruthenium (Ru); cobalt (Co); an alloy of one or more transition metals, such as cobalt-palladium (CoPd); an alloy of one or more transition metals and a metalloid, such as cobalt-iron-boron (CoFeB); and/or an alloy of any one or more thereof. In some embodiments, fixed magnetic layer 212 is composed of a single CoFeB layer, while in other embodiments fixed magnetic layer is composed of a CoFeB/Ru/CoFeB stack, for example. In accordance with some embodiments, fixed magnetic layer 212 may be formed, for example, using: a physical vapor deposition (PVD) process, such as sputter deposition; a chemical vapor deposition (CVD) process; atomic layer deposition (ALD) process; and/or a molecular beam epitaxy (MBE) process. Fixed magnetic layer 212 may have any suitable thickness, such as a thickness in the range of 20-30 nm, for example, in some embodiments. Other suitable materials and techniques for forming fixed magnetic layer 212 will depend on a given application and will be apparent in light of this disclosure.

Tunnel barrier layer 214 can formed from any suitable electrically insulating material (or combination of such materials), using any of a wide range of techniques. In some embodiments, tunnel barrier layer 214 is composed of a material suitable for allowing current of a majority spin to pass through the layer, while impeding (at least to some extent) current of a minority spin to pass through the layer, as is customarily the case for tunneling or tunnel barrier layers. For example, in some cases, tunnel barrier layer 214 may be formed from an oxide, such as magnesium oxide (MgO), aluminum oxide ($Al_2O_3$), or any other suitable tunnel materials. In accordance with some embodiments, tunnel barrier layer 214 can be formed using any of the example formation techniques discussed above with reference to fixed magnetic layer 212. Tunnel barrier layer 214 may have any suitable thickness, such as a thickness of 1 nm or less, for example, in some embodiments. Other suitable materials and techniques for forming tunnel barrier layer 214 will depend on a given application and will be apparent in light of this disclosure.

Free magnetic layer 216 can be formed from any of the example magnetic materials discussed above, for instance, with respect to fixed magnetic layer 212, in accordance with some embodiments. In some embodiments, free magnetic layer 216 is composed of a material suitable for transitioning between a majority spin and a minority spin, depending on the application. Also, free magnetic layer 216 may be permitted to undergo changes in its magnetization, and thus may be considered, in a general sense, as being a free or dynamic magnetic layer. Thus, the free magnetic layer 216 (or memory layer) may be referred to as a ferromagnetic memory layer, in some instances. In some example cases, free magnetic layer 216 may be formed as a single layer of CoFeB. As will be further appreciated, free magnetic layer 216 can be formed using any of the example formation techniques discussed above with reference to fixed magnetic layer 212, in accordance with some embodiments. Free magnetic layer 216 may have any suitable thickness, such as a thickness in the range of 1-2 nm, for example, in some embodiments. Other suitable materials and techniques for forming free magnetic layer 216 will depend on a given application and will be apparent in light of this disclosure.

Figure 2B:
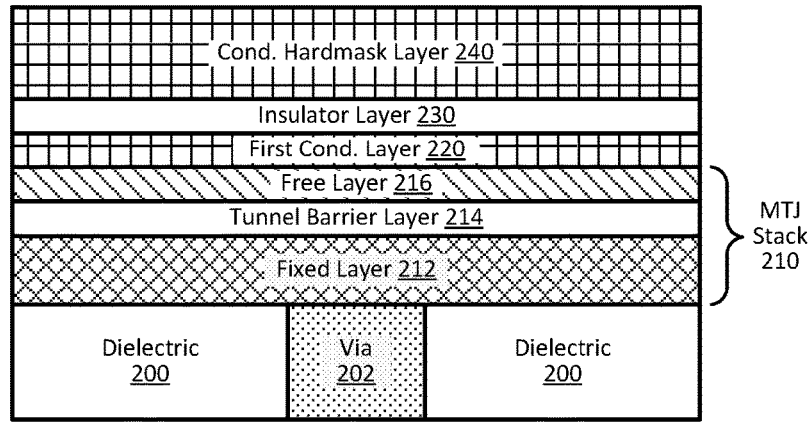

Method 100 continues with depositing 104 first conductive layer 220 on MTJ stack 210, depositing 106 insulator layer 230 thereon, and then optionally depositing 108 conductive hardmask layer 240 thereon, to form the resulting example structure shown in FIG. 2B, in accordance with an embodiment. Depositions 104, 106, and 108 may be performed using the example techniques discussed above (e.g., PVD, CVD, ALD, MBE, etc.), or using any other suitable technique. Further, in some embodiments, depositions 104, 106, and/or 108 may be performed in-situ/without air break to, for example, prevent undesired oxidation of one or more of the layers. First conductive layer 220 and conductive hardmask layer 240 may comprise any suitable conductive materials (such as various metals or metal alloys), including, but not limited to, ruthenium (Ru), tungsten (W), titanium (Ti), tantalum (Ta), titanium nitride (TiN), and/or tantalum nitride (TaN). In some embodiments, first conductive layer 220 may be used as an etch stop layer for etch 116, as will be discussed herein. Insulator layer 230 may comprise any suitable electrically insulative material, including, but not limited to, various dielectric materials, such as those previously listed with respect to dielectric 200. In some embodiments, insulator layer 230 may be formed from the deposition of a thin layer of metal (e.g., Ta) followed by oxidation of that thin metal layer to form an insulative material layer 230 (and then depositing conductive hardmask layer 240 thereon). Insulator layer 230 may have any suitable thickness, such as a thickness of at least 1 nm, for example, in some embodiments.

Figure 2C:
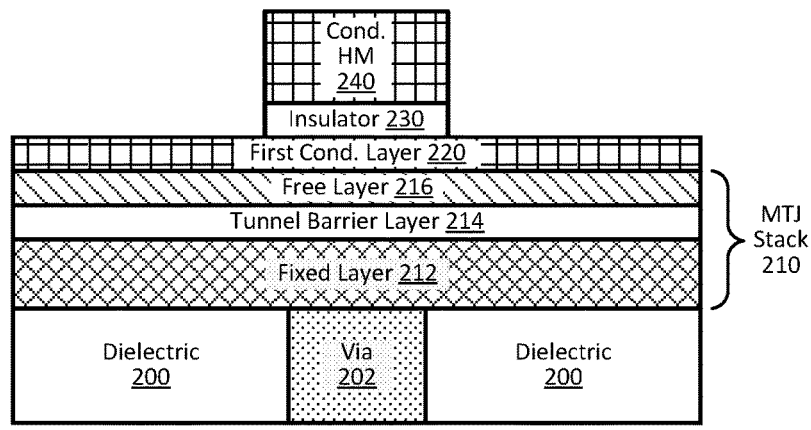
Figure 2B:
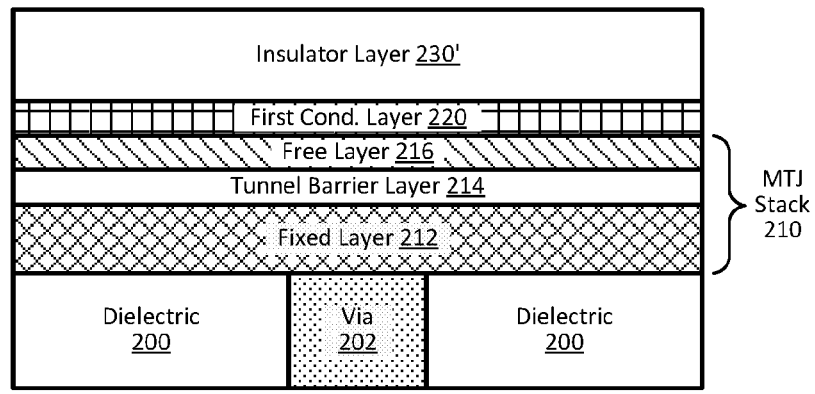
Figure 2C:
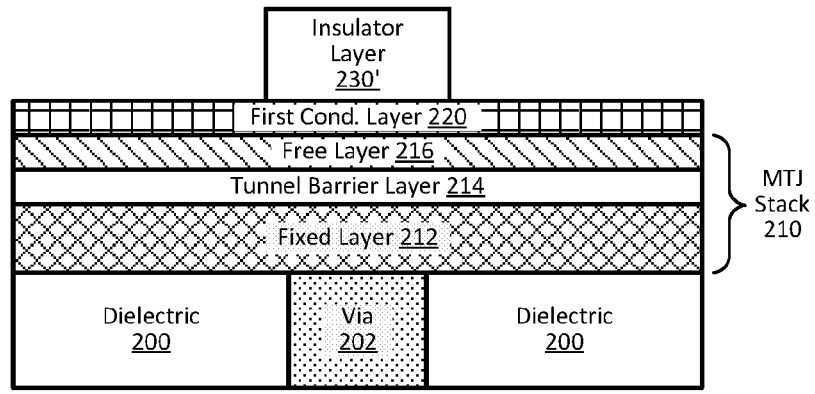

Method 100 continues with optionally etching 110 conductive hardmask layer 240 and etching 112 insulator layer 230, to form the resulting example structure shown in FIG. 2C, in accordance with an embodiment. Etches 110 and 112 may be performed using any suitable etching techniques and may include any number of suitable patterning processes. For example, in some embodiments, etch 110 of conductive hardmask layer 240 may be any custom dry etch process and etch 112 of insulator layer 230 may be any suitable dry or wet etch. In some embodiments, the etches may be performed in-situ/without air break, where just the etching gasses are changed from etch 110 to 112.

Recall that, in some embodiments, deposition 108 and etch 110 of conductive hardmask layer 240 are both optional processes. Therefore, in embodiments where deposition 108 and etch 110 are not performed, conductive hardmask layer 240 will be absent from the structure, such as is shown in the resulting example structures of FIGS. 2B' and 2C'. Note that in such embodiments, insulator layer 230' may be thicker (e.g., as compared to insulator layer 230) as a result of the absence of a conductive hardmask layer deposited thereon. For example, in some such embodiments, insulator layer 230' may have a thickness of 2 nm or greater, or a thickness of 5 nm or greater, as will be apparent in light of this disclosure. Such embodiments where conductive hardmask layer 240 is absent will be discussed in more detail below, with reference to FIG. 2H'.

Figure 2D:
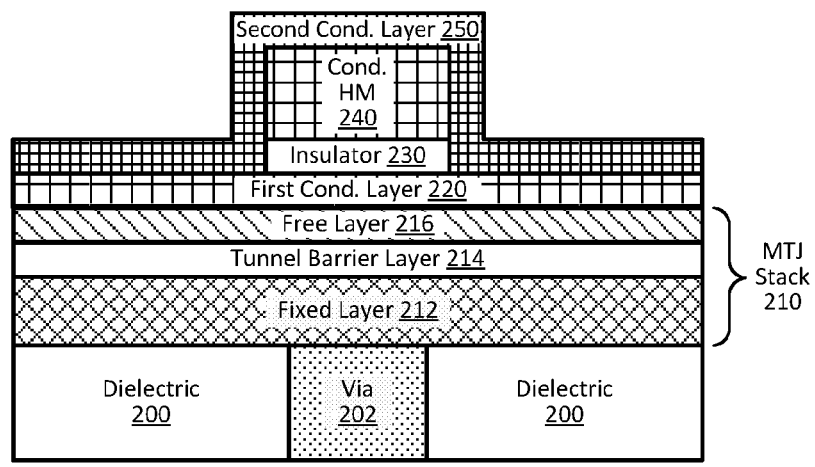

Method 100 continues with optionally depositing 114 second conductive layer 250 on the topography of the structure formed after etch 112, to form the resulting example structure shown in FIG. 2D, in accordance with an embodiment. Deposition 114 may be performed using the example techniques discussed above (e.g., PVD, CVD, ALD, MBE, etc.). In some embodiments, deposition 114 is a conformal deposition process (e.g., a conformal CVD or ALD process) used to achieve a sufficiently consistent thickness of second conductive layer 250 over an uneven/non-planar structure (e.g., as is the case in FIG. 2D). Second conductive layer 250 may comprise any suitable conductive materials (such as various metals or metal alloys), including, but not limited to, ruthenium (Ru), tungsten (W), titanium (Ti), tantalum (Ta), titanium nitride (TiN), and/or tantalum nitride (TaN). In some embodiments, etch 112 and deposition 114 may be performed in-situ/without air break to, for example, prevent undesired oxidation of first conductive layer 220. Note that in embodiments where first conductive layer 220 comprises ruthenium (Ru), deposition 114 can be performed ex-situ, because oxidized Ru is conductive. Also note that in some embodiments, first conductive layer 220 and/or conductive metal hardmask 240 and/or second conductive layer 250 may comprise the same material (e.g., layers 220 and 250 can both be Ru). Further note that in some embodiments, optional deposition 114 of second conductive layer 250 need not be performed, as will be described in more detail below with reference to FIG. 2E.

Figure 2E:
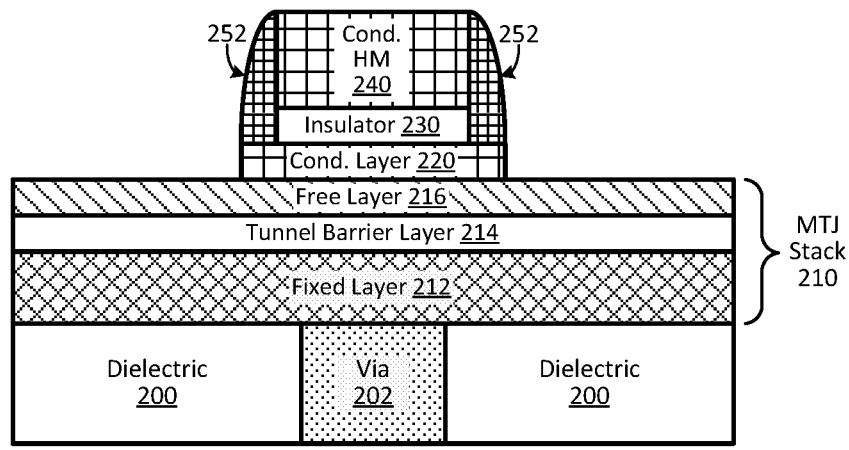

Method 100 continues with etching 116 conductive layers 220 and 250 to form conductive spacer 252 as shown in the example resulting structure of FIG. 2E, in accordance with an embodiment. Etch 116 may be performed using any suitable dry or wet etching techniques and may include any number of suitable patterning processes. In some embodiments, a reactive ion etch (RIE) process and/or ion milling process may be used to form conductive spacer 252. In some embodiments, a dry plasma-based etch process may be used. In some embodiments, etch 116 uses etchants that are not volatile, such as argon and/or krypton (e.g., during ion bombardment), or some combination of $O_2$, $Cl_2$, and/or Ar. As previously described, in some cases, first conductive layer 230 may be used as an etch stop layer to assist with etch 116. In addition, in some cases, insulator layer 230 may be used as an etch stop layer, followed by a selective etch of insulator 230. Note that etch 116 stops on free layer 216 in this example embodiment.

Recall that deposition 114 of second conductive layer is optional, and in embodiments where deposition 114 is not performed, second conductive layer 250 (e.g., as shown in FIG. 2D) is not formed. In such embodiments, a non-volatile etch can be performed during etch 116 to cause portions of first conductive layer 220 to be displaced onto sidewalls of insulative layer 230 and conductive hardmask 240 to form conductive spacer 252. An example resulting structure of such embodiments is shown in FIG. 2E, except that in such example embodiments, conductive spacer 252 is formed from first conductive layer 220 and not second conductive layer 250, as a result of using a non-volatile etch as previously described.

Figure 2F:
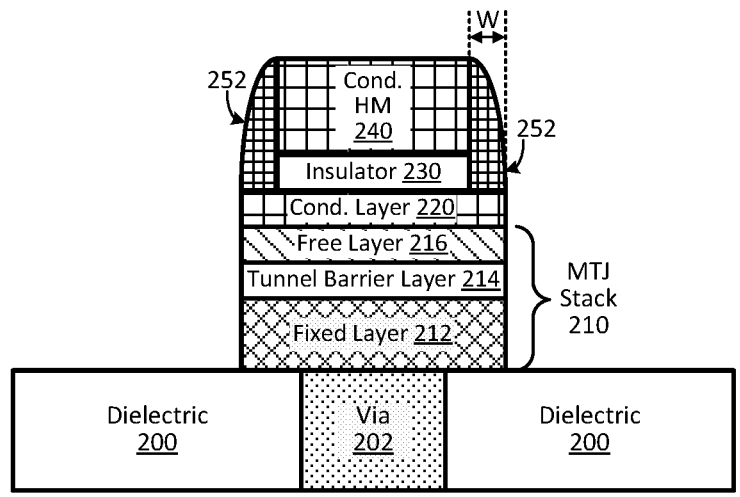

Method 100 continues with etching 118 MTJ stack 210 (including free magnetic layer 216, tunnel barrier layer 214, and fixed magnetic layer 212), to form the example resulting structure shown in FIG. 2F, in accordance with an embodiment. Etch 118 may be performed using any suitable dry or wet etching techniques and may include any number of suitable patterning processes. In some embodiments, etch 116 and etch 118 are performed in-situ/without air break to preserve one or more of the layers of MTJ stack 210. Note that etch 118 stops on the substrate (and the substrate comprises dielectric 200 and via 202, in this example case).

Figure 2G:
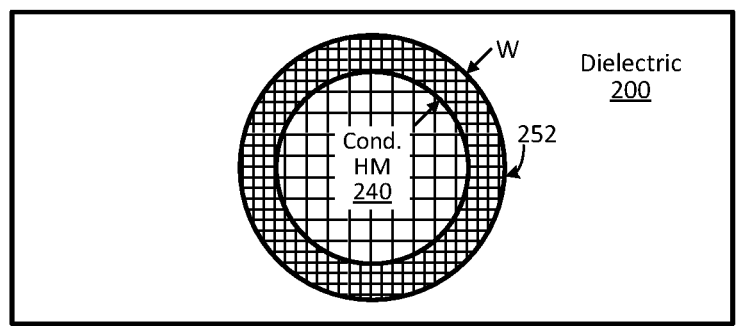

FIG. 2G shows a top view of the resulting structure shown in FIG. 2F (where FIG. 2F shows a front view of the structure), in accordance with an embodiment. As can be seen in FIG. 2G, conductive spacer 252 provides an annular contact to free layer 216, and more specifically, a contact having a circular ring/band shape. Note that the shape of contacts as variously described herein (e.g., annular, circular, elliptical, hollow, etc.) is the shape as viewed from the top of the integrated circuit structure. Recall that annular contact 252 may be any suitable hollow shape, such as an ellipse, and therefore the example shape shown in FIG. 2G is provided for ease of description. In this example embodiment, conductive spacer/annular contact 252 has a consistent width W (as indicated in FIGS. 2F and 2G). In some cases, width W may be at least approximately 3 nm (e.g., due to resistance concerns); however, width W may be any suitable thickness, such as 1-100 nm, or any other suitable thickness as will be apparent in light of this disclosure. Note that via 202 is shown as being completely covered in FIG. 2G; however, that need not be the case.

In embodiments, where the annular contact is not an exact circle, the width of annular contact may vary, such that it has thinner portions and thicker portions, and even portions having intermediate thicknesses. In some embodiments, the annular contact may have an elliptical ring/band shape. In some such embodiments, the elliptical annular contact may have dimensions of 30×50 nm, 40×75 nm, 50×100 nm, 60×120 nm, or some other suitable dimensions based on the target application. Recall that the annular contact need not be an exact circular or elliptical ring/band shape, so long as the annular contact is hollow. In some embodiments, the hole in the annular contact (e.g., the hole created by conductive hardmask 240 and insulator layer 230 inside of annular contact/conductive spacer 252) may range from 30-90% of the area of the entire shape (i.e., the annular contact plus its hole) and/or 30-90% of the area of free layer 216.

Method 100 continues with optionally completing formation 120 of a spin-transfer torque memory (STTM) element (or some other suitable memory element), as shown in the example resulting structure of FIG. 2H, in accordance with an embodiment. In this example embodiment, a second (or top) via 204 is formed on the resulting structure shown in FIG. 2G, and dielectric material 201 surrounds and electrically isolates the resulting STTM element. The previous discussion with respect to via 202 and dielectric 200 apply, respectively, to via 204 and dielectric 201. FIG. 2H' shows an example resulting structure after optionally completing formation 120 of the STTM element, in the case where a conductive hardmask is not deposited on insulator layer 230' (e.g., as discussed above with reference to FIGS. 2B' and 2C'), in accordance with an embodiment. FIG. 2H" shows an example resulting structure after optionally completing formation 120 of the STTM element, in the case where an insulator layer is not deposited prior to depositing conductive hardmask 240", but instead conductive hardmask 240" is oxidized to form insulator 230", in accordance with an embodiment. In such embodiments, conductive hardmask 240" can be deposited without insulator layer 230 (e.g., if insulator 230 were absent from the structure shown in FIG. 2C). Further, in such embodiments, conductive hardmask 240" may be oxidized using any suitable techniques to convert the exposed portion of conductive hardmask 240" to insulator 230" or to form insulator 230" over conductive hardmask 240", and thereby form the resulting example structure shown in FIG. 2H".

FIGS. 2I-2I" illustrate the structures of FIGS. 2H-H", respectively, electrically activated to show example current flow lines 260-260", in accordance with some embodiments. In the example embodiment of FIG. 2I, the structure is an STTM element (e.g., a bit cell), and when electrically activated, current 260 flows: down via 204, into conductive hardmask 240 and conductive spacers 252, around insulator 230, through first conductive layer 220, into magnetic free layer 216, and then down through the rest of MTJ stack 210 and via 202. When current 260 flows down annular contact/conductive spacers 252 and around insulator 230, a local current density increase occurs. Current 260, having an increased current density, continues through to the edge/outside of free layer 216 as can be seen in FIG. 2I. This causes the portions of free layer 216 where current 260 is passing through to flip (if current density meets a certain threshold), driving the rest of free layer 216 into the opposite state. Because annular contact/conductive spacer 252 and insulator layer 230 cause an increase in current density through free layer 216 (e.g., as compared to use of a full/non-annular contact for a given critical current), a lower critical current can be used for a given MTJ stack 210. Note that in the example embodiment of FIG. 2I', current 260' flows through annular contact/conductive spacer 252' and around insulator 230', since a conductive hardmask is absent. Further note that in the example embodiment of FIG. 2I", current 260" flows through annular contact/conductive spacer 252" and around insulator 230", since insulator 230" covers conductive hardmask 240". Recall that in this example embodiment, insulator 230" may be an oxidized layer of conductive hardmask 240", as previously described.

The configurations shown in FIGS. 2I' and 2I" also result in a local current density increase in free layer 216, as can be seen and as described above. In some embodiments, bottom via 202 (and thus fixed magnetic layer 212) may be electrically connected to a bit line and top via 204 (and thus free magnetic layer 216) may be electrically connected to a transistor, as will be apparent in light of this disclosure.

Figure 3:
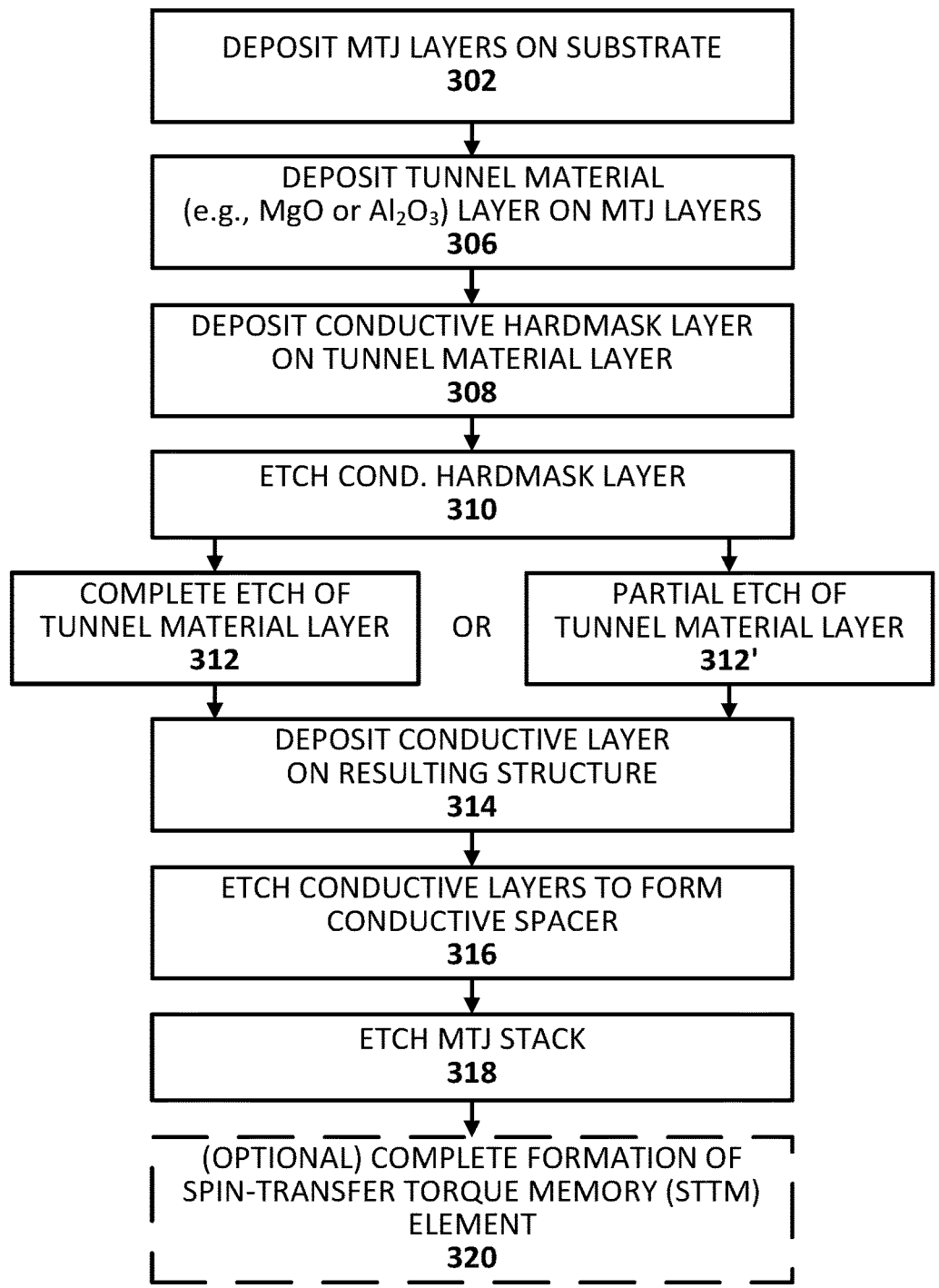
FIG. 3 illustrates a method of forming an integrated circuit, in accordance with one or more embodiments of the present disclosure.

FIG. 3 illustrates a method 300 of forming an integrated circuit, in accordance with one or more embodiments of the present disclosure. FIGS. 4A-H' illustrate example structures that are formed when carrying out method 300 of FIG. 3, in accordance with various embodiments. FIGS. 4I-I' illustrate the structures of FIGS. 4H-H', respectively, electrically activated to show example current flow lines 460 and 460', in accordance with some embodiments. The previous discussion above with respect to FIGS. 1 and 2A-I' is equally applicable here, as will be appreciated. Similar numbering is used to identify the processes in FIG. 3 as was used in FIG. 1, except that FIG. 3 includes numbering in the 300s, whereas FIG. 1 includes numbering in the 100s (e.g., deposition 302 is similar to deposition 102, etch 318 is similar to etch 118, etc.). Further, similar numbering is used to identify the features in FIGS. 4A-I' as was used in FIGS. 2A-I', except that FIGS. 4A-I' include numbering in the 400s, whereas FIGS. 2A-I' include numbering in the 200s (e.g., via 402 is similar to via 202, MTJ 410 stack is similar to MTJ stack 210, etc.). Therefore, only the differences between the embodiments in FIGS. 3 and 4A-I' relative to FIGS. 1 and 2A-I' will primarily be discussed.

Figure 4A:
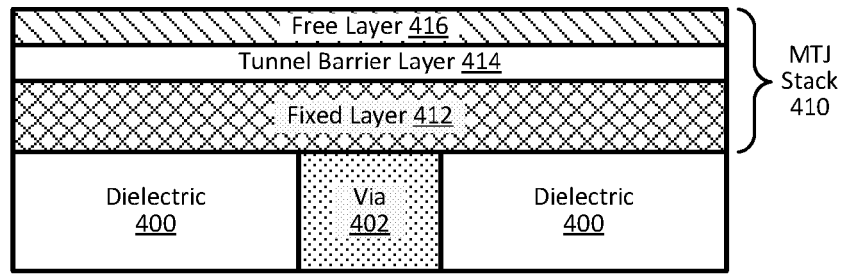
FIGS. 4A-H' illustrate example structures that are formed when carrying out the method of FIG. 3, in accordance with various embodiments.

As can be seen in FIG. 3, method 300 includes depositing 302 MTJ layers 310 on a substrate to form the example resulting structure shown in FIG. 4A, in accordance with an embodiment. In this example embodiment, the substrate includes a first (or bottom) via 402 having dielectric layer 400 on either side of via 402. The previous description with respect to the MTJ stack (which includes fixed magnetic layer 412, tunnel barrier layer 414, and free magnetic layer 416, in this example embodiment), the first (or bottom) via, and the dielectric layer is equally applicable here.

Figure 4B:
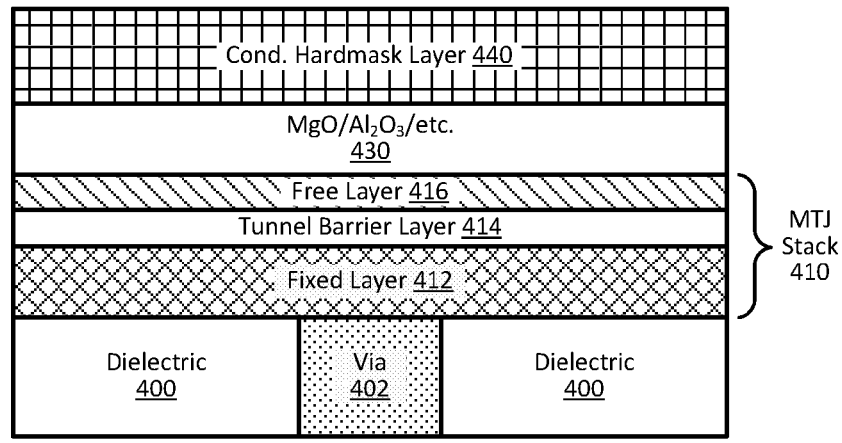

Method 300 continues with depositing 306 tunnel material layer 430 on MTJ stack 410, and then depositing 308 conductive hardmask layer 440 thereon, to form the example resulting structure shown in FIG. 4B, in accordance with an embodiment. Deposition 306 may be performed using the example techniques discussed above (e.g., PVD, CVD, ALD, MBE, etc.), or using any other suitable technique. Recall that in the embodiment of FIG. 2B, a first conductive layer (e.g., a metal layer, such as a Ru layer) is deposited directly on the free layer. However, in the embodiment shown in FIG. 4B, tunnel material layer 430 is deposited directly on free layer 416. Tunnel material layer 430 may comprise magnesium oxide (MgO), aluminum oxide ($Al_2O_3$), tantalum oxide ($Ta_2O_5$) or some other suitable tunnel material based on the target application and as will be apparent in light of this disclosure. For example, tunnel material layer 430 may comprise some other suitable conductive oxide or any material suitable for the application of a tunnel barrier layer in an MTJ. Depositing a tunnel material (e.g., as compared to other dielectric materials) directly on free layer 416 can increase the stability of the MTJ device, because of the interface created at tunnel material layer 430 and free layer 416. In some embodiments, tunnel material layer 430 may be deposited to have any suitable thickness (e.g., a thickness greater than 1 nm), as will be apparent in light of this disclosure. The previous description with respect to the conductive hardmask layer and corresponding deposition is equally applicable here.

Figure 4C:
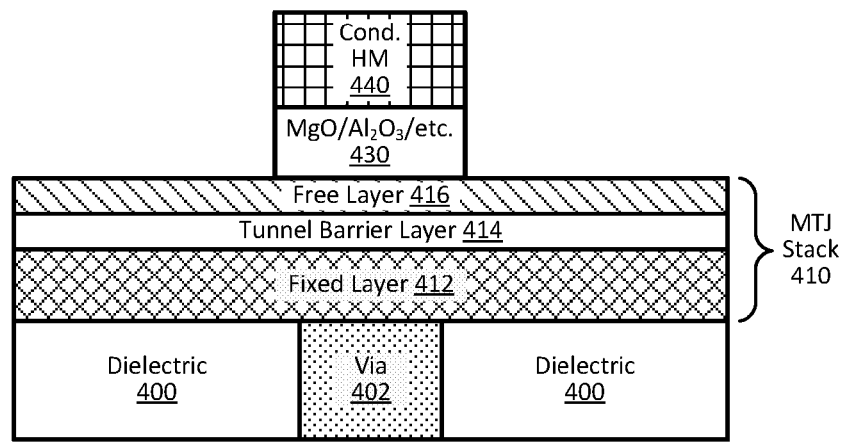
Figure 4C:
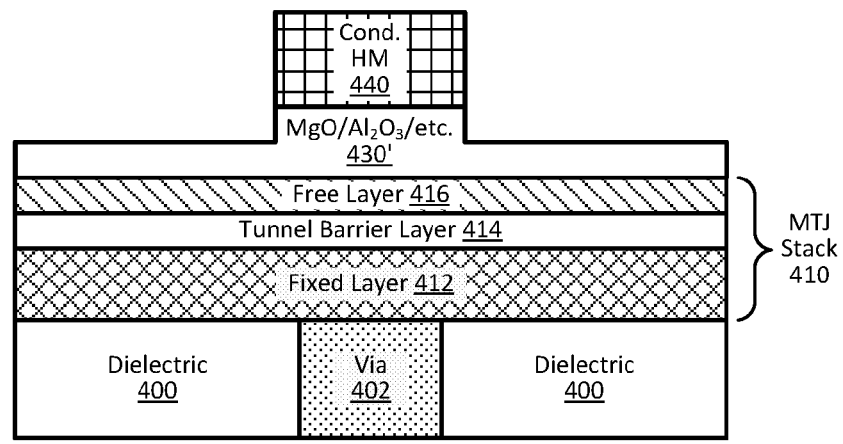

Method 300 continues with etching 310 conductive hardmask layer 440 and etching 312 tunnel material layer 430, to form the resulting example structure shown in FIG. 2C, in accordance with an embodiment. The previous description with respect to etching the conductive hardmask layer is equally applicable here. Etch 312 in this example embodiment is a full/complete etch of tunnel material layer 430, leaving only the portion of layer 430 that is under conductive hardmask 440, as can be seen in FIG. 4C. In the embodiment shown in FIG. 4C', a partial etch 312' is performed to form the partially etched tunnel material layer 430'. As will be discussed herein, partial etch 312' may etch tunnel material layer 430' down to a thickness of 1 nm or less, in some cases, to allow current to pass through this thinner portion (e.g., in a manner similar to the way that current can pass through tunnel barrier layer 414), but can ensure that the full free layer has some tunnel material 430' on top of it as shown, for example, in FIG. 4C'. Further, in some such embodiments, by performing only a partial etch 312' of tunnel material layer 430', free magnetic layer 416 is unexposed, which can aid in the protection of this underlying layer 416, as will be apparent in light of this disclosure.

Figure 4D:
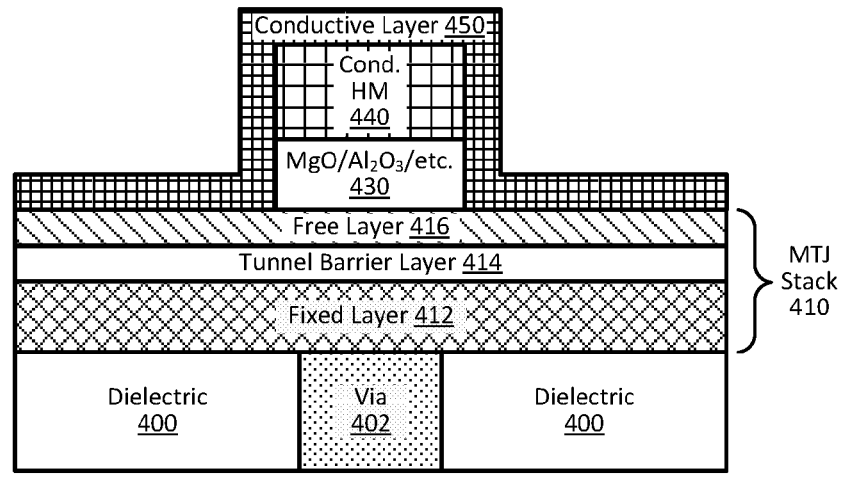

Method 300 continues with depositing 314 conductive layer 450 on the topography formed after etch 312, to form the resulting example structure shown in FIG. 4D, in accordance with an embodiment. The previous description with respect to depositing this conductive layer is equally applicable here. In some embodiments, etch 312 and deposition 314 may be performed in-situ/without air break to, for example, prevent undesired oxidation of free magnetic layer 416.

Figure 4E:
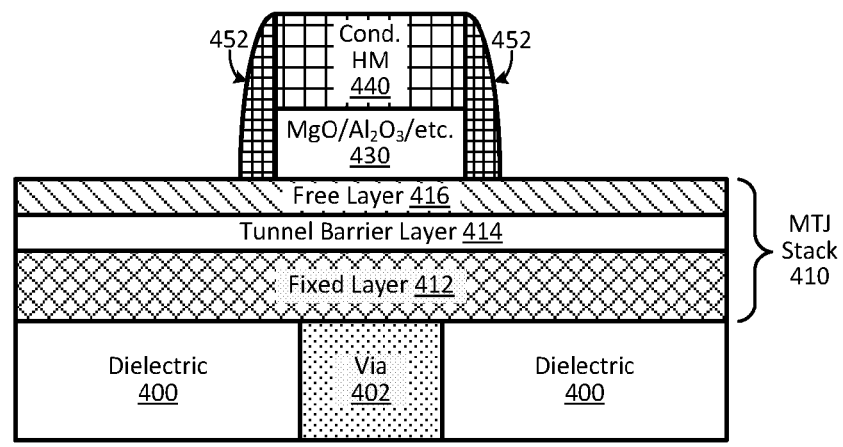
Figure 4F:
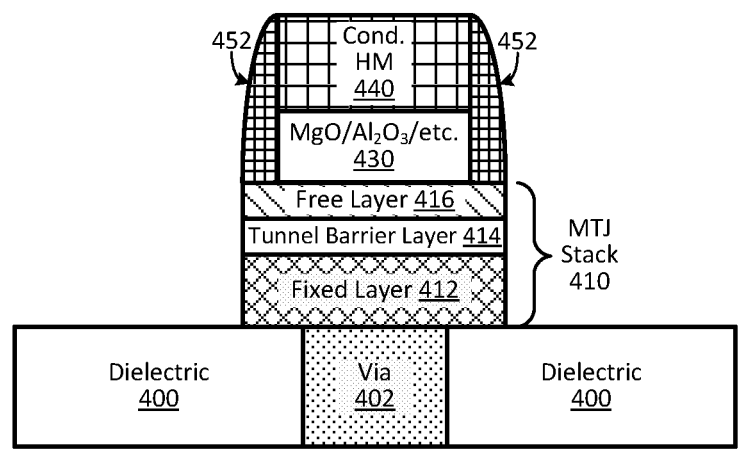
Figure 4G:
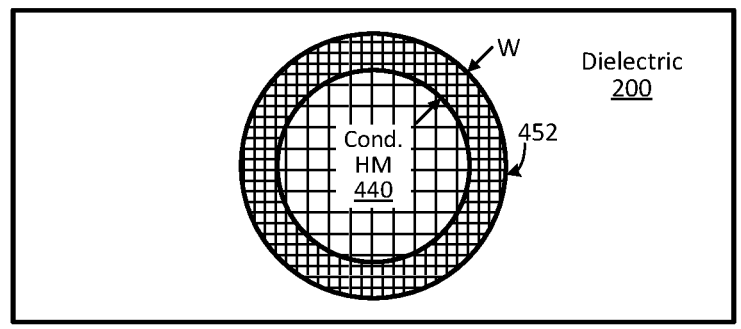

Method 300 continues with etching 316 conductive layer 450 to form conductive spacer 452 as shown in the example resulting structure of FIG. 4E. Method 300 continues with etching 318 MTJ stack 410 (including free magnetic layer 416, tunnel barrier layer 414, and fixed magnetic layer 412), to form the example resulting structure shown in FIG. 4F. The previous description with respect to etching the conductive layer to form a conductive spacer and etching the MTJ stack is equally applicable here. FIG. 4G shows a top view of the resulting structure shown in FIG. 4F (where FIG. 4F shows a front view of the structure). The previous description with respect to the conductive spacer/annular contact is equally applicable here.

Figure 4H:
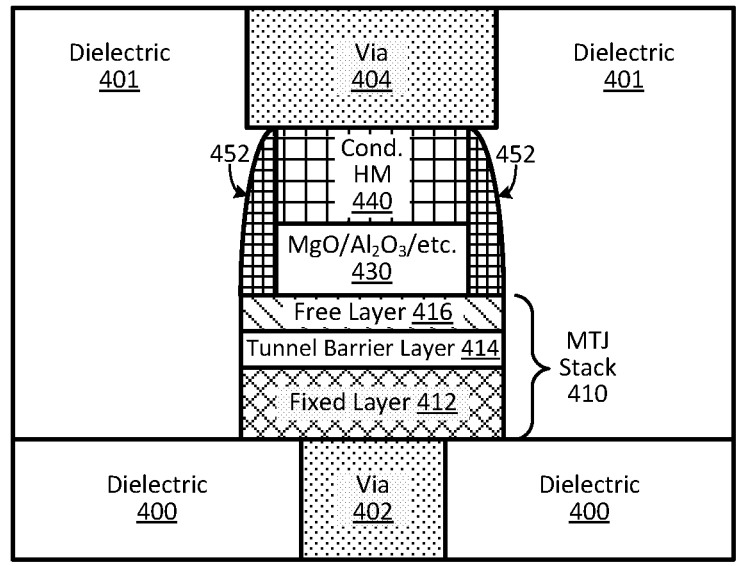
Figure 4H:
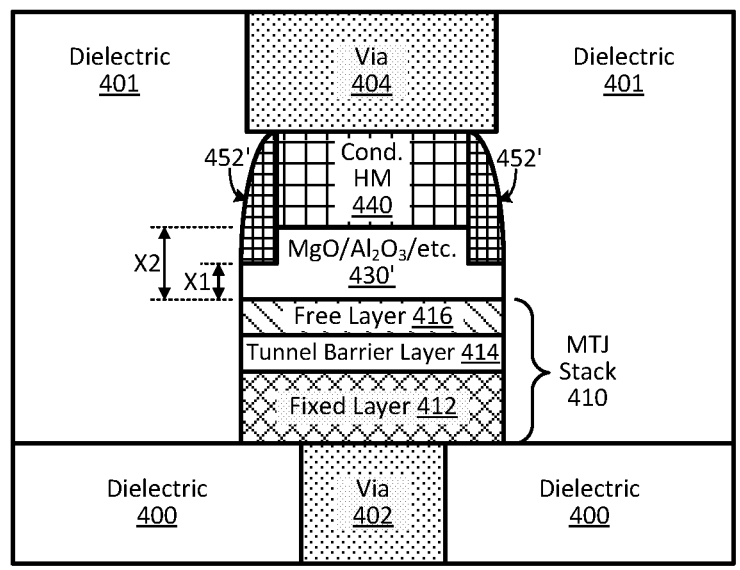
Figure 4I:
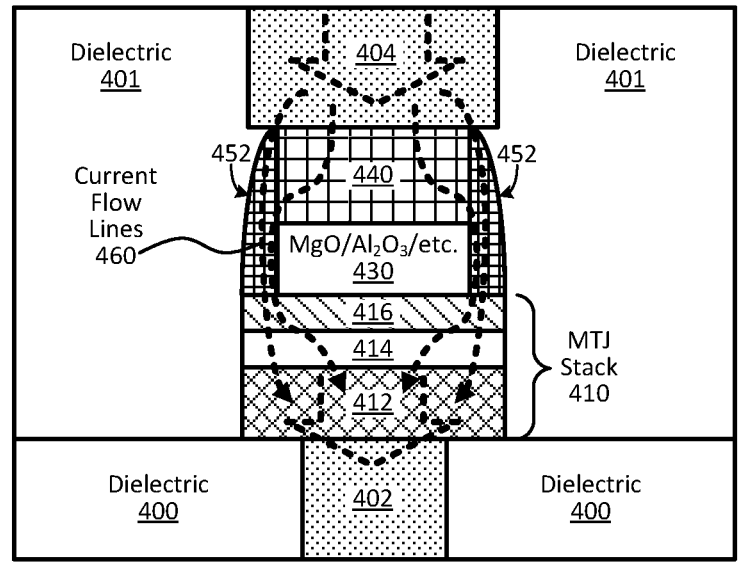
FIGS. 4I-I' illustrate the structures of FIGS. 4H-H', respectively, electrically activated to show example current flow lines, in accordance with some embodiments.
Figure 4I:
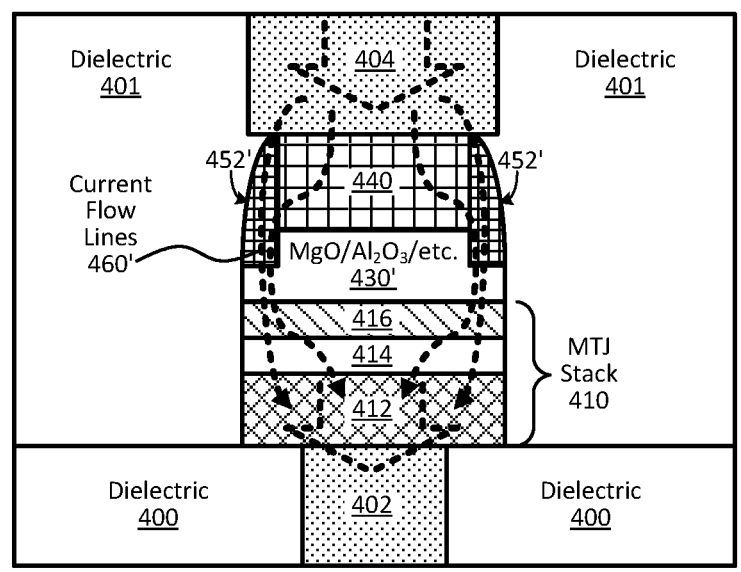

Method 300 continues with optionally completing formation 320 of a spin-transfer torque memory (STTM) element (or some other suitable memory element), as shown in the example resulting structure of FIG. 4H, in accordance with an embodiment. In this example embodiment, a second (or top) via 404 is formed on the resulting structure shown in FIG. 4G, and dielectric material 401 surrounds and electrically isolates the resulting STTM element. The previous discussion with respect to optionally completing formation of the STTM element is equally applicable here.

FIG. 4H' shows an example resulting structure after optionally completing formation 120 of the STTM element, in the case where partial etch 312' of tunnel material layer 430' is performed (e.g., as discussed above with reference to FIG. 4C'), in accordance with an embodiment. As can be seen in FIG. 4H', tunnel material layer 430' has a first (thinner) thickness X1 and a second (thicker) thickness X2 as a result of partial etch 312'. As can also be seen, conductive spacer/annular contact 452' is formed over the second/thinner portion X2 of tunnel material layer 430'. As previously described, in some cases, thin portion X2 of tunnel material layer 430' is 1 nm or less (e.g., 0.5 nm in some cases), or some other suitable thickness, to allow current to pass through it at the thinner X2 locations. Further, in some cases, thick portion X1 of tunnel material layer 430' is greater than 1 nm (e.g., at least 2 nm in some cases), or some other suitable thickness, to prevent current from passing through it at the thicker X1 locations.

FIGS. 4I-4I' illustrate the structures of FIGS. 4H-H', respectively, electrically activated to show example current flow lines 460 and 460', in accordance with some embodiments. In the example embodiment of FIG. 4I, the structure is an STTM element (e.g., a bit cell), and when electrically activated, current 460 flows: down via 404, into conductive hardmask 440 and conductive spacers 452, around tunnel material layer 430, into magnetic free layer 416, and then down through the rest of MTJ stack 410 and via 402. The previous discussion with respect to the increase in current density as a result of current crowding caused by use of an annular contact is equally applicable here. Note that in the example embodiment of FIG. 4I', current 460' flows through conductive hardmask 440 and annular contact/conductive spacer 452' through thin portion X1 of tunnel material layer 430' and around the thick portion X2 of layer 430', since the thick portion X2 prevents current from passing while the thin portion X1 allows current to pass or tunnel through. In some embodiments, bottom via 402 (and thus fixed magnetic layer 412) may be electrically connected to a bit line and top via 404 (and thus free magnetic layer 416) may be electrically connected to a transistor, as will be apparent in light of this disclosure.

Example System

Figure 5:
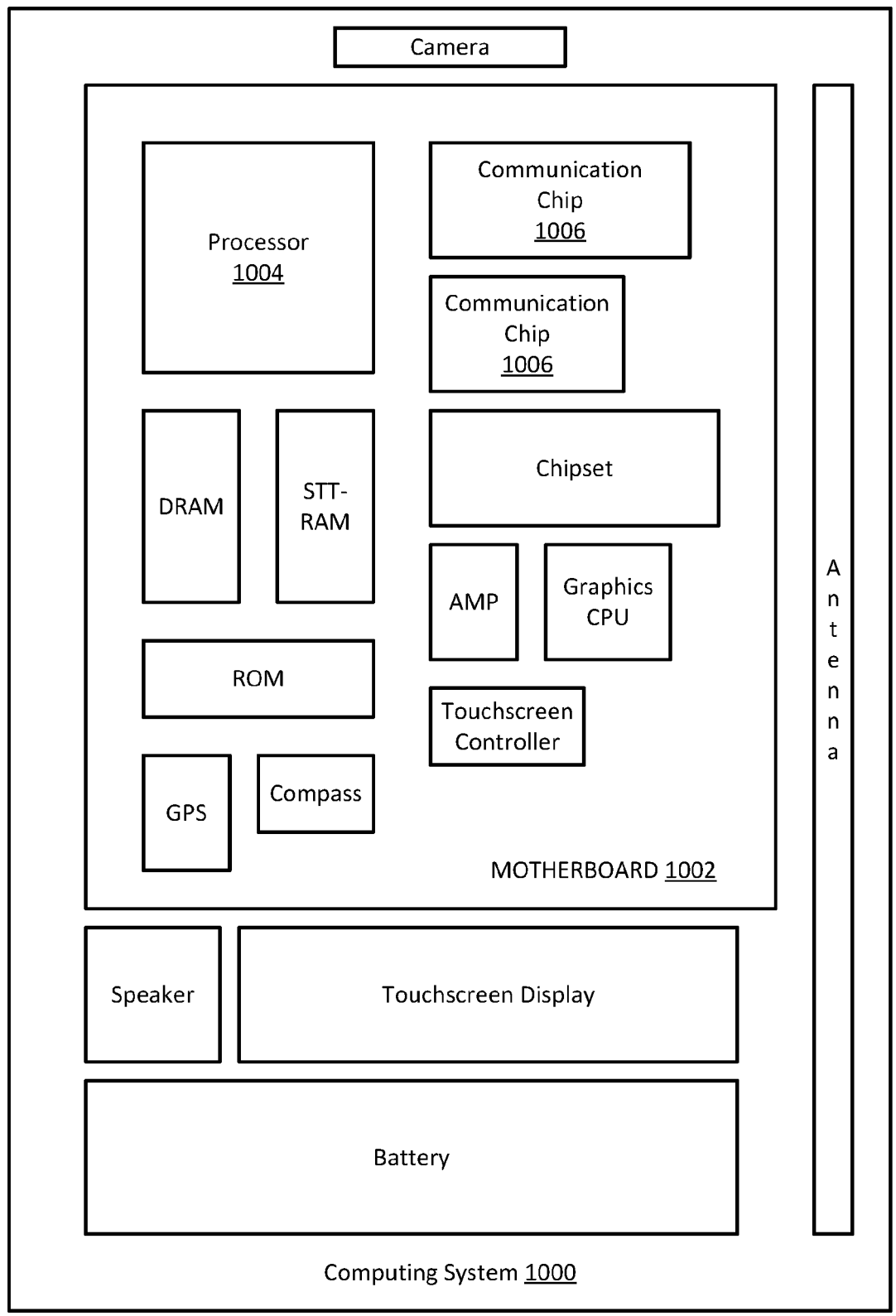
FIG. 5 illustrates a computing system implemented with integrated circuit structures or devices formed using the techniques disclosed herein, in accordance with an example embodiment.

FIG. 5 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, STTM, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising: a fixed magnetic layer; a free magnetic layer above the fixed magnetic layer; a tunneling barrier layer disposed between the fixed and free magnetic layers; an insulator layer formed above the free magnetic layer; and a conductive annular contact surrounding at least a portion of the insulator layer and electrically connected to the free magnetic layer.

Example 2 includes the subject matter of Example 1, wherein the fixed magnetic layer, tunneling barrier layer, and free magnetic layer comprise a magnetic tunnel junction (MTJ).

Example 3 includes the subject matter of any of Examples 1-2, wherein the annular contact has a substantially circular, elliptical, square, or rectangular ring/band shape.

Example 4 includes the subject matter of any of Examples 1-3, wherein the annular contact comprises at least one of ruthenium (Ru), tungsten (W), titanium (Ti), tantalum (Ta), titanium nitride (TiN), and/or tantalum nitride (TaN).

Example 5 includes the subject matter of any of Examples 1-4, wherein from a top perspective of the integrated circuit, the annular contact surface area comprises 10-90% of the surface area of the free magnetic layer.

Example 6 includes the subject matter of any of Examples 1-5, wherein the annular contact has a minimal width of at least 3 nm.

Example 7 includes the subject matter of any of Examples 1-6, wherein at least a portion of the insulator layer is at least 1 nm thick.

Example 8 includes the subject matter of any of Examples 1-7, wherein the insulator layer comprises a dielectric material.

Example 9 includes the subject matter of any of Examples 1-8, further comprising a conductive layer disposed between the free magnetic layer and the insulator layer.

Example 10 includes the subject matter of Example 9, wherein the conductive layer comprises at least one of ruthenium (Ru), tungsten (W), titanium (Ti), tantalum (Ta), titanium nitride (TiN), and/or tantalum nitride (TaN).

Example 11 includes the subject matter of any of Examples 1-7, wherein the insulator layer comprises magnesium oxide (MgO) or aluminum oxide ($Al_2O_3$).

Example 12 includes the subject matter of Example 11, wherein the annular contact physically contacts the free magnetic layer.

Example 13 includes the subject matter of Example 11, wherein a thickness of the MgO or $Al_2O_3$ layer is disposed between the annular contact and the free magnetic layer.

Example 14 includes the subject matter of Example 13, wherein the thickness is less than 1 nm.

Example 15 includes the subject matter of any of Examples 1-14, further comprising a conductive hardmask adjacent to the insulator layer, wherein the annular contact surrounds at least a portion of the conductive hardmask.

Example 16 includes the subject matter of Example 15, wherein the conductive hardmask comprises at least one of ruthenium (Ru), tungsten (W), titanium (Ti), tantalum (Ta), titanium nitride (TiN), and/or tantalum nitride (TaN).

Example 17 includes the subject matter of any of Examples 1-16, wherein the fixed magnetic layer is electrically connected to a bit line and the free magnetic layer is electrically connected to a transistor.

Example 18 is an embedded memory device comprising the subject matter of any of Examples 1-17.

Example 19 includes the subject matter of Example 18, wherein the embedded memory device is a spin-torque transfer memory (STTM) device.

Example 20 is a method of forming an integrated circuit, the method comprising: depositing magnetic tunnel junction (MTJ) layers on a substrate, the MTJ layers comprising a fixed magnetic layer, a free magnetic layer, and a tunneling barrier layer disposed between the fixed and free magnetic layers; depositing a first conductive layer on the free magnetic layer; depositing an insulator over the first conductive layer; etching the insulator layer; etching the first conductive layer to form a conductive spacer around at least a portion of the insulator layer; and etching the MTJ layers.

Example 21 includes the subject matter of Example 20, wherein the conductive spacer has a substantially circular, elliptical, square, or rectangular ring/band shape.

Example 22 includes the subject matter of any of Examples 20-21, wherein from a top perspective of the integrated circuit, the conductive spacer surface area comprises 10-90% of the surface area of the free magnetic layer.

Example 23 includes the subject matter of any of Examples 20-22, wherein the conductive spacer comprises at least one of ruthenium (Ru), tungsten (W), titanium (Ti), tantalum (Ta), titanium nitride (TiN), and/or tantalum nitride (TaN).

Example 24 includes the subject matter of any of Examples 20-23, further comprising: depositing a conductive hardmask layer on the insulator layer prior to etching the insulator layer; and etching the conductive hardmask layer.

Example 25 includes the subject matter of any of Examples 20-24, wherein etching the first conductive layer includes a non-volatile etch process.

Example 26 includes the subject matter of any of Examples 20-25, further comprising: depositing a second conductive prior to etching the first conductive layer; and etching the second conductive layer prior to etching the first conductive layer.

Example 27 includes the subject matter of Example 26, wherein etching the insulator layer and depositing the second conductive layer are performed in-situ or without air break.

Example 28 includes the subject matter of any of Examples 25-27, wherein depositing the second conductive layer is performed using a conformal deposition process.

Example 29 includes the subject matter of any of Examples 25-28, wherein etching the conductive layers is performed using a reactive ion etch (RIE) process.

Example 30 is a method of forming an integrated circuit, the method comprising: depositing magnetic tunnel junction (MTJ) layers on a substrate, the MTJ layers comprising a fixed magnetic layer, a free magnetic layer, and a tunneling barrier layer disposed between the fixed and free magnetic layers; depositing a tunnel material layer on the free magnetic layer; depositing a conductive hardmask layer on the tunnel material layer; etching the conductive hardmask layer; etching the tunnel material layer; depositing a conductive layer over resulting topography; etching the conductive layer to form a conductive spacer around at least a portion of the tunnel material layer; and etching the MTJ layers.

Example 31 includes the subject matter of Example 30, wherein the conductive spacer has a substantially circular, elliptical, square, or rectangular ring/band shape.

Example 32 includes the subject matter of any of Examples 30-31, wherein from a top perspective of the integrated circuit, the conductive spacer surface area comprises 10-90% of the surface area of the free magnetic layer.

Example 33 includes the subject matter of any of Examples 30-32, wherein the conductive spacer comprises at least one of ruthenium (Ru), tungsten (W), titanium (Ti), tantalum (Ta), titanium nitride (TiN), and/or tantalum nitride (TaN).

Example 34 includes the subject matter of any of Examples 30-33, wherein depositing the conductive layer is performed using a conformal deposition process.

Example 35 includes the subject matter of any of Examples 30-34, wherein etching the conductive layer is performed using a reactive ion etch (RIE) process.

Example 36 includes the subject matter of any of Examples 30-35, wherein depositing the tunnel material layer results in the tunnel material layer having a thickness of greater than 1 nm.

Example 37 includes the subject matter of any of Examples 30-36, wherein etching the tunnel material layer is a complete etch of the tunnel material down to the free magnetic layer.

Example 38 includes the subject matter of any of Examples 30-37, wherein etching the tunnel material layer is a partial etch of the tunnel material, leaving a thin portion of tunnel material on the free magnetic layer.

Example 39 includes the subject matter of Example 38, wherein the thin portion of tunnel material has a thickness of 1 nm or less.

Example 40 includes the subject matter of any of Examples 30-39, wherein etching the tunnel material layer and depositing the conductive layer are performed in-situ or without air break.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a fixed magnetic layer;
a free magnetic layer above the fixed magnetic layer;
a tunneling barrier layer between the fixed and free magnetic layers;
an insulator layer above the free magnetic layer, the insulator layer including a vertical thickness greater than 1 nanometer (nm); and
a conductive annular contact surrounding at least a portion of the insulator layer and electrically connected to the free magnetic layer.

2. The integrated circuit of claim 1, wherein the fixed magnetic layer, tunneling barrier layer, and free magnetic layer comprise a magnetic tunnel junction (MTJ).

3. The integrated circuit of claim 1, wherein the annular contact has a substantially circular, elliptical, square, or rectangular ring/band shape.

4. The integrated circuit of claim 1, wherein the annular contact includes at least one of ruthenium (Ru), tungsten (W), titanium (Ti), tantalum (Ta), titanium nitride (TiN), and tantalum nitride (TaN).

5. The integrated circuit of claim 1, wherein from a top perspective of the integrated circuit, the annular contact surface area comprises 10-90% of the surface area of the free magnetic layer.

6. The integrated circuit of claim 1, wherein the annular contact has a minimal width of at least 3 nm.

7. The integrated circuit of claim 1, wherein the vertical thickness of the insulator layer is greater than 2 nm.

8. The integrated circuit of claim 1, wherein the insulator layer includes a dielectric material.

9. The integrated circuit of claim 1, further comprising a conductive layer between the free magnetic layer and the insulator layer.

10. The integrated circuit of claim 1, wherein the insulator layer essentially consists of magnesium oxide (MgO) or aluminum oxide ($Al_2O_3$).

11. The integrated circuit of claim 10, wherein the annular contact physically contacts the free magnetic layer.

12. The integrated circuit of claim 10, wherein the vertical thickness of the insulator layer that is greater than 1 nm is a first vertical thickness that is not between the annular contact and the free magnetic layer, and wherein a second vertical thickness of the insulator layer is between the annular contact and the free magnetic layer.

13. The integrated circuit of claim 12, wherein the second vertical thickness of the insulator layer between the annular contact and the free magnetic layer is less than 1 nm.

14. The integrated circuit of claim 1, further comprising a conductive hardmask above the insulator layer, wherein the annular contact surrounds at least a portion of the conductive hardmask.

15. The integrated circuit of claim 1, wherein the vertical thickness of the insulator layer that is greater than 1 nm is a first vertical thickness that is not between the annular contact and the free magnetic layer, a second vertical thickness of the insulator layer between the annular contact and the free magnetic layer is less than 1 nm, and the difference between the first and second vertical thicknesses is at least 0.5 nm.

16. An embedded memory device comprising the integrated circuit of claim 1.

17. The embedded memory device of claim 16, wherein the embedded memory device is a spin-torque transfer memory (STTM) device.

18. A method of forming an integrated circuit, the method comprising:
forming magnetic tunnel junction (MTJ) layers on a substrate, the MTJ layers including a fixed magnetic layer, a free magnetic layer, and a tunneling barrier layer between the fixed and free magnetic layers;
forming an insulator layer above the free magnetic layer, wherein the insulator layer includes a vertical thickness greater than 1 nanometer (nm); and
forming a conductive annular contact surrounding at least a portion of the insulator layer, wherein the conductive annular contact is electrically connected to the free magnetic layer.

19. The method of claim 18, further comprising:
forming a conductive hardmask layer on the insulator layer prior to forming the conductive annular contact.

20. The method of claim 18, wherein forming the conductive annular contact includes a non-volatile etch process.

21. The method of claim 18, further comprising:
forming a conductive layer above the free magnetic layer prior to forming the insulator layer, such that the conductive layer is between the free magnetic layer and the insulator layer.

22. A method of forming an integrated circuit, the method comprising:
depositing magnetic tunnel junction (MTJ) layers on a substrate, the MTJ layers including a fixed magnetic layer, a free magnetic layer, and a tunneling barrier layer between the fixed and free magnetic layers;
depositing an insulator layer above the free magnetic layer;
depositing a conductive hardmask layer on the insulator layer;

etching the conductive hardmask layer;
at least partially etching the insulator layer to form a structure, wherein the insulator layer includes a vertical thickness greater than 1 nanometer;
depositing a conductive layer over the structure;
etching the conductive layer to form a conductive spacer that surrounds at least a portion of the insulator layer; and
etching the MTJ layers.

23. The method of claim 22, wherein etching the insulator layer includes a complete removal of the insulator layer in areas not under the conductive hardmask.

24. The method of claim 22, wherein etching the insulator layer includes only a partial etch of the insulator layer in areas not under the conductive hardmask, such that a resulting thinner portion of the tunnel layer is in areas not under the conductive hardmask, the thinner portion of the tunnel layer including a smaller vertical thickness relative to the portion of the tunnel layer under the conductive hardmask.

25. The method of claim 24, wherein the thinner portion of the insulator layer has a thickness of 1 nm or less, such that the portion of the insulator layer under the conductive hardmask includes the vertical thickness that is greater than 1 nm.

* * * * *